(12) United States Patent
del Puerto

(10) Patent No.: US 7,697,115 B2
(45) Date of Patent: Apr. 13, 2010

(54) RESONANT SCANNING MIRROR

(75) Inventor: Santiago E. del Puerto, Milton, NY (US)

(73) Assignee: ASML Holding N.V., Veldhoven (NL)

( * ) Notice: Subject to any disclaimer, the term of this patent is extended or adjusted under 35 U.S.C. 154(b) by 526 days.

(21) Appl. No.: 11/473,326

(22) Filed: Jun. 23, 2006

(65) Prior Publication Data

US 2008/0013097 A1    Jan. 17, 2008

(51) Int. Cl.
*G03B 27/54* (2006.01)

(52) U.S. Cl. .............................. 355/67; 355/53; 355/66; 355/77; 250/492.22

(58) Field of Classification Search .................... 355/53, 355/66–72, 52, 55, 77; 347/234; 359/199.1, 359/213.1, 224.1, 198.1, 214.1, 224.2; 250/492.1, 250/492.2, 492.22, 548
See application file for complete search history.

(56) References Cited

U.S. PATENT DOCUMENTS

| | | | | | |
|---|---|---|---|---|---|
| 3,742,234 | A | * | 6/1973 | Laakmann | 250/235 |
| 3,811,748 | A | * | 5/1974 | Treuthart | 359/221 |
| 3,936,193 | A | * | 2/1976 | Auth | 356/452 |
| 4,025,203 | A | * | 5/1977 | Lee | 359/224.1 |
| 4,155,630 | A | | 5/1979 | Ih | |
| 4,327,975 | A | * | 5/1982 | Harris | 353/50 |
| 4,491,383 | A | | 1/1985 | Pera et al. | |
| 4,577,932 | A | | 3/1986 | Gelbart | |
| 4,668,080 | A | | 5/1987 | Gale et al. | |
| 4,708,420 | A | * | 11/1987 | Liddiard | 359/199 |
| 4,726,671 | A | | 2/1988 | Ahmad et al. | |
| 4,732,440 | A | * | 3/1988 | Gadhok | 359/214 |
| 4,851,978 | A | | 7/1989 | Ichihara | |
| 4,861,125 | A | * | 8/1989 | Vaught | 359/214 |
| 4,970,546 | A | | 11/1990 | Suzuki et al. | |
| 5,121,138 | A | * | 6/1992 | Schermer et al. | 347/250 |
| 5,229,872 | A | | 7/1993 | Mumola | |

(Continued)

FOREIGN PATENT DOCUMENTS

EP    0 823 662 A2    2/1998

(Continued)

OTHER PUBLICATIONS

U.S. Appl. No. 11/297,641, filed Dec. 9, 2005.

(Continued)

*Primary Examiner*—Peter B Kim
*Assistant Examiner*—Christina Riddle
(74) *Attorney, Agent, or Firm*—Sterne, Kessler, Goldstein & Fox P.L.L.C.

(57) ABSTRACT

A system and method allow for a more effective synchronous scanning mirror (SSM). A lithography apparatus comprises an illumination system, a patterning device, a substrate table, and a projection system. The illumination system conditions a beam of radiation received from a radiation source operating at a first frequency. The patterning device patterns the beam. The substrate table supports and scans a substrate at a scanning velocity. The projection system includes a scanning device including a reflective device and a plurality of flexures. The plurality of flexures being configured to allow the reflective device to resonate about an axis of rotation. The scanning device is configured to scan the patterned beam onto a target area of the substrate The resonant frequency of the scanning device is substantially equal to the first frequency, and is synchronized with the scanning velocity.

21 Claims, 17 Drawing Sheets

U.S. PATENT DOCUMENTS

| | | | |
|---|---|---|---|
| 5,296,891 A | | 3/1994 | Vogt et al. |
| 5,430,571 A | * | 7/1995 | Witteveen ................... 359/216 |
| 5,500,736 A | | 3/1996 | Koitabashi et al. |
| 5,523,193 A | | 6/1996 | Nelson |
| 5,530,482 A | | 6/1996 | Gove et al. |
| 5,579,147 A | | 11/1996 | Mori et al. |
| 5,677,703 A | | 10/1997 | Bhuva et al. |
| 5,684,566 A | | 11/1997 | Stanton |
| 5,808,797 A | | 9/1998 | Bloom et al. |
| 5,949,544 A | * | 9/1999 | Manning ................... 356/452 |
| 5,969,441 A | | 10/1999 | Loopstra et al. |
| 5,982,553 A | | 11/1999 | Bloom et al. |
| 6,046,792 A | | 4/2000 | Van Der Werf et al. |
| 6,133,986 A | | 10/2000 | Johnson |
| 6,177,980 B1 | | 1/2001 | Johnson |
| 6,204,875 B1 | | 3/2001 | De Loor et al. |
| 6,249,381 B1 | | 6/2001 | Suganuma |
| 6,268,904 B1 | | 7/2001 | Mori et al. |
| 6,317,169 B1 | | 11/2001 | Smith |
| 6,379,867 B1 | | 4/2002 | Mei et al. |
| 6,556,279 B1 | | 4/2003 | Meisburger et al. |
| 6,633,366 B2 | | 10/2003 | de Jager et al. |
| 6,687,041 B1 | | 2/2004 | Sandstrom |
| 6,707,534 B2 | | 3/2004 | Bjorklund et al. |
| 6,731,376 B1 | | 5/2004 | Markle |
| 6,747,783 B1 | | 6/2004 | Sandstrom |
| 6,753,947 B2 | | 6/2004 | Meisburger et al. |
| 6,765,712 B2 | * | 7/2004 | Van Dijsseldonk et al. .. 359/291 |
| 6,795,169 B2 | | 9/2004 | Tanaka et al. |
| 6,798,494 B2 | * | 9/2004 | Naulleau ................... 355/67 |
| 6,803,938 B2 | * | 10/2004 | Turner ................... 347/237 |
| 6,806,897 B2 | | 10/2004 | Kataoka et al. |
| 6,811,953 B2 | | 11/2004 | Hatada et al. |
| 6,831,765 B2 | * | 12/2004 | Yasuda et al. ................ 359/224 |
| 7,015,491 B2 | | 3/2006 | Eurlings et al. |
| 7,098,871 B1 | | 8/2006 | Tegreene et al. |
| 7,283,210 B2 | * | 10/2007 | Hazelton ................... 355/72 |
| 7,367,931 B2 | | 5/2008 | Barclay et al. |
| 2001/0010536 A1 | | 8/2001 | Katzir et al. |
| 2001/0048515 A1 | | 12/2001 | Mei |
| 2003/0006360 A1 | | 1/2003 | Hatam-Tabrizi et al. |
| 2003/0123040 A1 | | 7/2003 | Almogy |
| 2004/0001265 A1 | * | 1/2004 | Pesik ................... 359/883 |
| 2004/0041104 A1 | | 3/2004 | Liebregts et al. |
| 2004/0076203 A1 | | 4/2004 | Kaminsky et al. |
| 2004/0130561 A1 | | 7/2004 | Jain |
| 2004/0141166 A1 | * | 7/2004 | Bleeker et al. ................ 355/53 |
| 2005/0007572 A1 | | 1/2005 | George et al. |
| 2005/0116038 A1 | * | 6/2005 | Lewis et al. ................ 235/454 |
| 2006/0018025 A1 | | 1/2006 | Sharon et al. |
| 2006/0061749 A1 | | 3/2006 | Bleeker et al. |
| 2006/0087635 A1 | * | 4/2006 | Kazumi et al. ................ 355/69 |
| 2006/0110665 A1 | | 5/2006 | Bleeker et al. |
| 2007/0150778 A1 | | 6/2007 | Visser et al. |
| 2007/0150779 A1 | | 6/2007 | Visser et al. |
| 2007/0162781 A1 | | 7/2007 | Visser et al. |

FOREIGN PATENT DOCUMENTS

| | | |
|---|---|---|
| EP | 1 115 031 A2 | 7/2001 |
| EP | 1 469 348 A1 | 10/2004 |
| EP | 1 659 451 A2 | 5/2006 |
| EP | 1 795 966 A1 | 6/2007 |
| WO | WO 98/33096 | 7/1998 |
| WO | WO 98/38597 | 9/1998 |
| WO | WO 98/40791 A1 | 9/1998 |
| WO | WO 03/071353 A2 | 8/2003 |

OTHER PUBLICATIONS

U.S. Appl. No. 11/371,232, filed Mar. 8, 2006.

Response to Written Opinion dated Nov. 4, 2008 for European Application No. 07252547, 3 pgs.

Non-Final Rejection mailed Oct. 10, 2008 for U.S. Appl. No. 11/297,641, filed Dec. 9, 2005, 16 pgs.

Non-Final Rejection mailed Dec. 11, 2008 for U.S. Appl. No. 11/371,232 filed Mar. 9, 2006, 22 pgs.

Extended European Search Report issued for European Patent Application No. 07252547.0-1226/ 1870773, dated Jun. 23, 2009.

Final Rejection mailed Apr. 7, 2009 for U.S. Appl. No. 11/371,232 filed Mar. 9, 2006, 19 pgs.

Final Rejection mailed Mar. 23, 2009 for U.S. Appl. No. 11/297,641 filed Dec. 9, 2005, 13 pgs.

Notice of Allowance mailed Sep. 23, 2009 for U.S. Appl. No. 11/297,641 filed Dec. 9, 2005, 7 pgs.

* cited by examiner

RESONANT SCANNING MIRROR

CROSS REFERENCE TO RELATED APPLICATION(S)

This application is related to co-pending and co-owned U.S. application Ser. No. 11/297,641, filed Dec. 9, 2005 and Ser. No. 11/371,232, filed Mar. 8, 2006, which are both incorporated by reference herein in their entireties.

BACKGROUND

1. Field of the Invention

The present invention relates a lithographic apparatus and device manufacturing method.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Typically, if a source of radiation has jitter, a pulsed beam may be generated before or after a desired moment in time. This can cause a patterned light beam, formed from the pulsed beam interacting with a patterning device, to pattern the substrate in front of or behind a desired target position. A synchronous scanning mirror SSM, which is synchronized to both a frequency of the pulsed beam and a scanning velocity of the substrate, has typically been used to compensate for such jitter. Through using the synchronous scanning mirror SSM, the patterned beam can be directed onto a scanning substrate supported by a scanning substrate table at a desired target position. However, for maskless lithography, the synchronous scanning mirror SSM has to scan at high frequency (e.g., 6 kHz), a scanning motion has to be a pure rotation (small amplitude, +/−1.2 mrad), and a rotation axis must lie on an active surface of the synchronous scanning mirror SSM. Also, the synchronous scanning mirror SSM has to be of an excellent optical quality (i.e., very flat, in the order of about 0.5 nm flatness), which requires it to have substantial thickness, resulting in a large mass.

Conventional synchronous scanning mirror SSMs are typically incapable of producing a pure rotational scanning motion with low mirror distortion. Dynamically, the unavoidable existence of undesired modes with low eigenfrequencies (e.g., one of the frequencies with which a particular system may vibrate) makes it impossible to achieve a pure, distortion-free rotation. A second mode having eigenfrequency only 2× higher than the useful first mode produces out-of-plane translation and mirror distortion. In addition, from a manufacturability point of view, the requirement that an axis of rotation lay on a reflective surface of the synchronous scanning mirror SSM makes it difficult to access the reflective surface for polishing, unless the reflective surface is a separate part. With a separate reflective surface, mounting the reflective surface without introducing distortion and without introducing modes lower than the very high scanning frequency can present an unsolvable compromise.

Therefore, what is needed is a system and method that allows for a more effective synchronous scanning mirror SSM.

SUMMARY

In one embodiment of the present invention, there is provided a lithography apparatus comprising an illumination system, a patterning device, a substrate table, and a projection system. The illumination system conditions a beam of radiation from a radiation source operating at a first frequency. The patterning device patterns the beam. The substrate table supports and scans a substrate at a scanning velocity. The projection system includes a scanning device including a reflective device and a plurality of flexures. The plurality of flexures are configured to allow the reflective device to resonate about an axis of rotation. The scanning device is configured to scan the patterned beam onto a target area of the substrate The resonant frequency of the scanning device is substantially equal to the first frequency, and is synchronized with the scanning velocity.

In another embodiment of the present invention, there is provided a method including the following steps. A beam of radiation pulses is produced at a first frequency. A substrate is scanned using a substrate stage at a scanning velocity. The beam of radiation is patterned. A reflective device of a scanning mirror is resonated about an axis of rotation at substantially the first frequency using flexures coupled to the reflective device. The scanning of the scanning mirror is synchronized to both the first frequency and the scanning velocity, such that the patterned beam is directed onto a target portion of the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 7, 8, 9, and 10 show perspective, side, top, and operational perspective views of an synchronous scanning mirror SSM.

Figure 11:
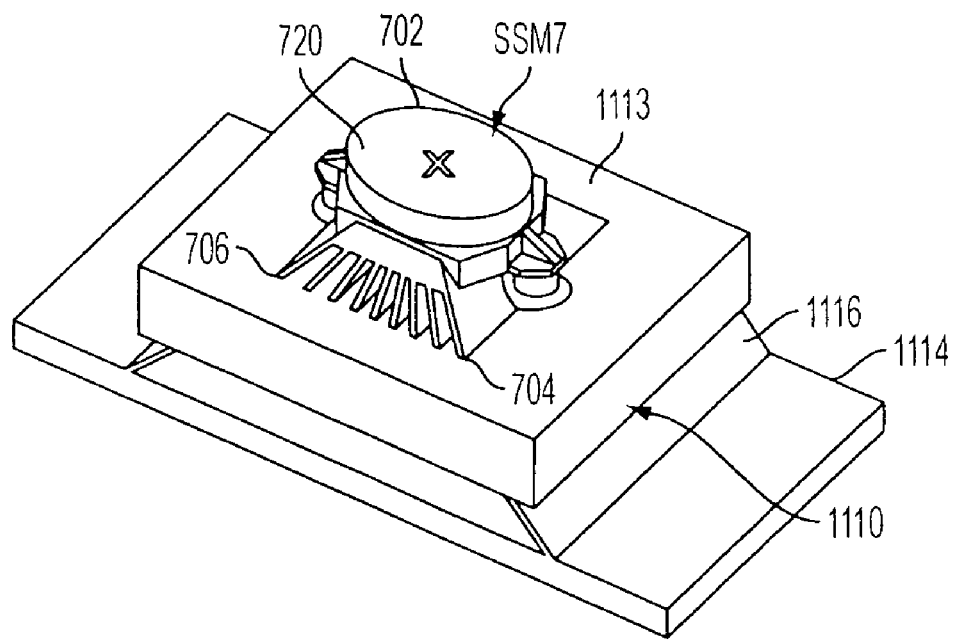
Figure 12:
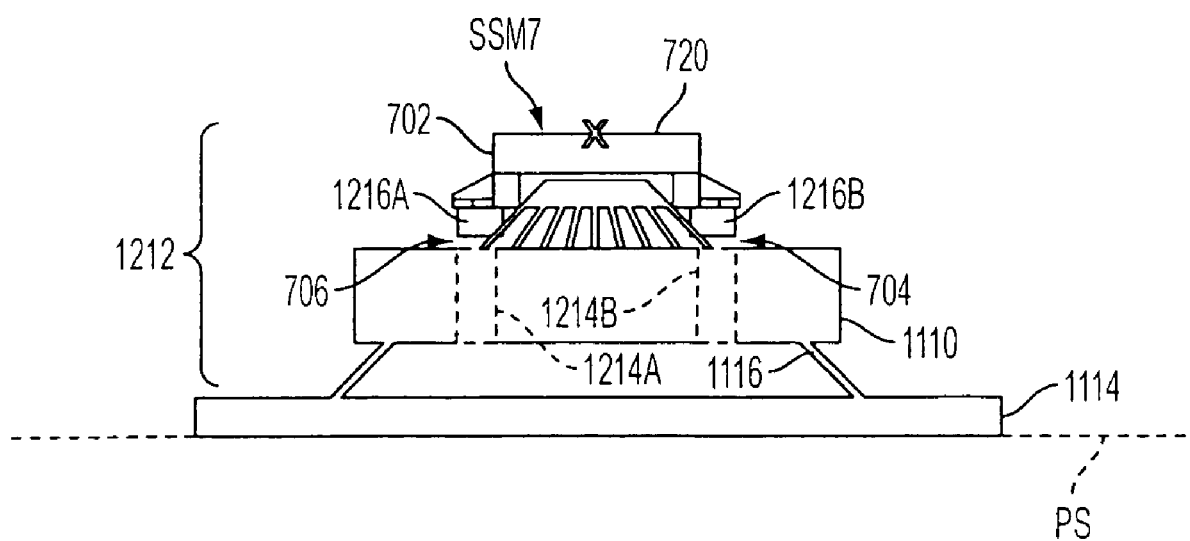

FIGS. 11 and 12 show perspective and side views, respectively, of a synchronous scanning mirror SSM coupled to an isolation mass and a driving system.

Figure 13:
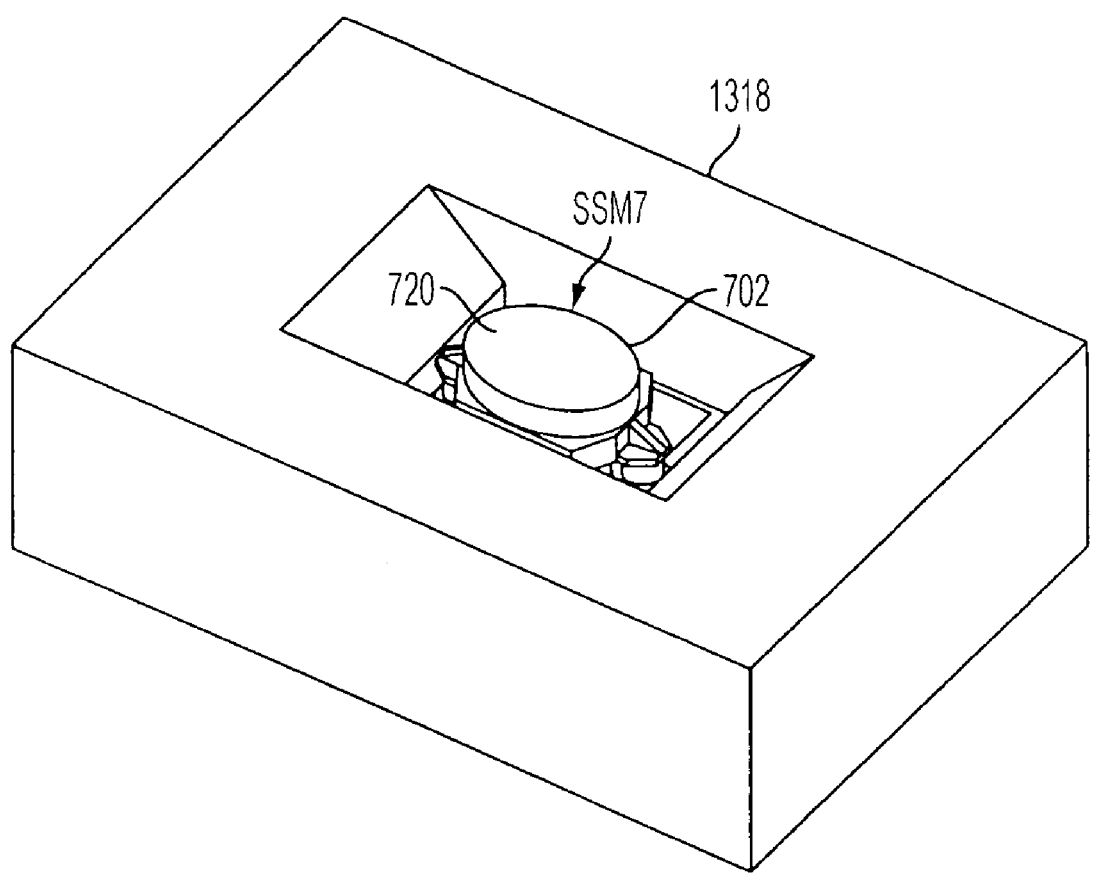
Figure 14:
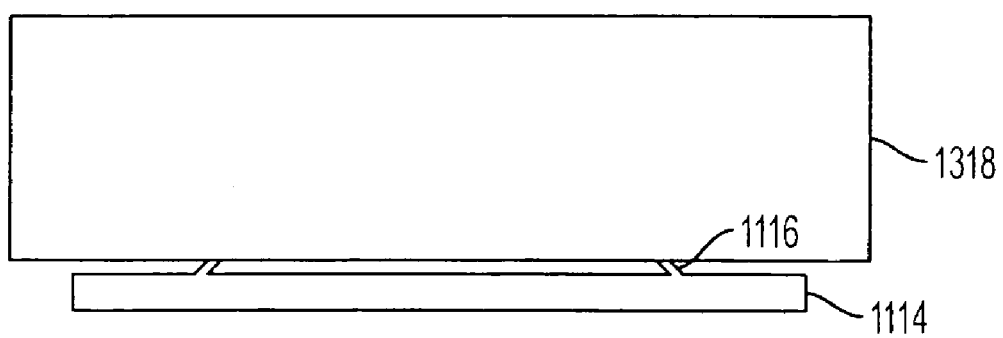

FIGS. 13 and 14 shows perspective and side views, respectively, of the synchronous scanning mirror SSM configuration of FIGS. 11 and 12 including an additional isolation mass.

Figure 15:
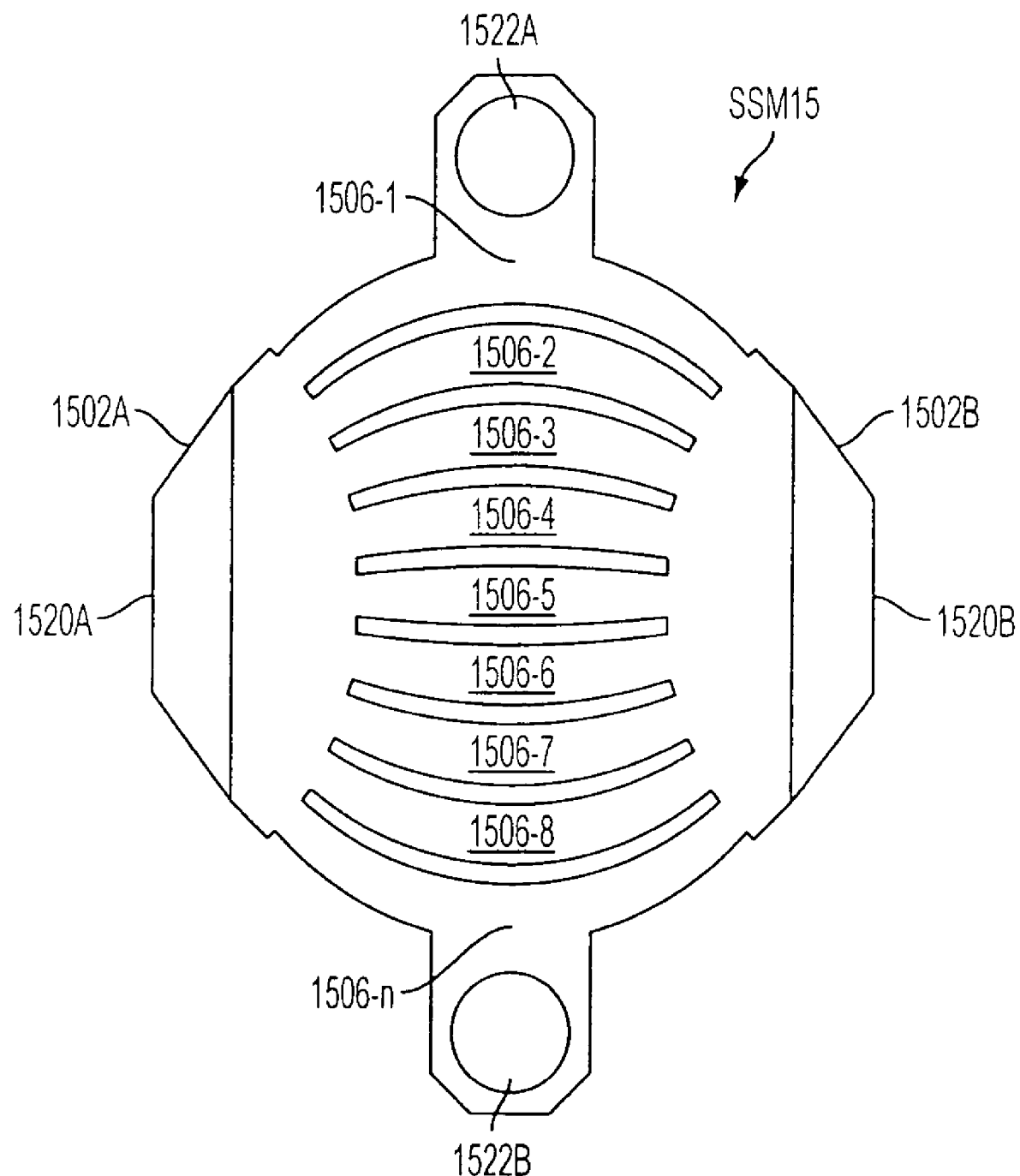
Figure 16:
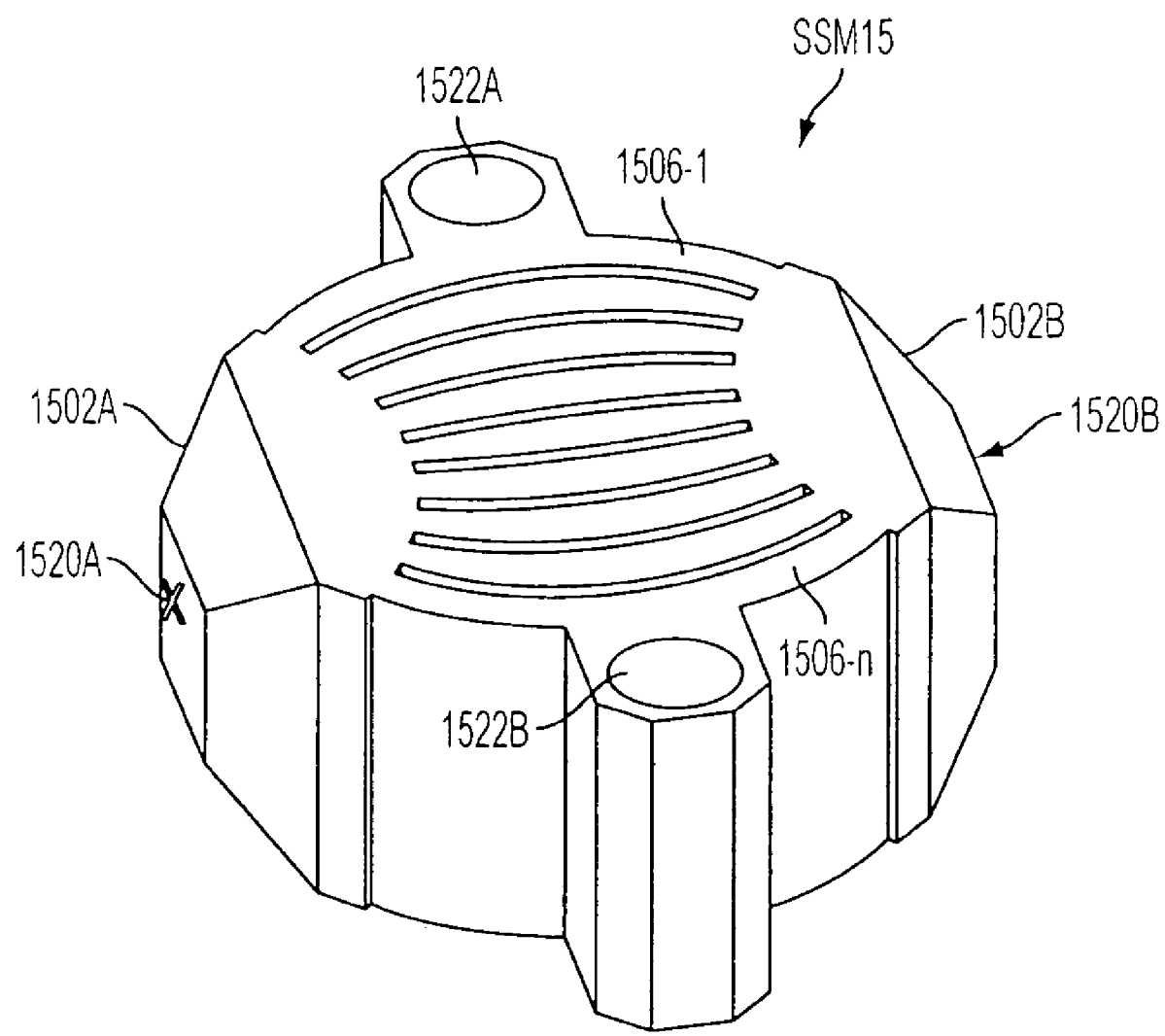

FIGS. 15 and 16 show a top and perspective view, respectively, of another embodiment of a synchronous scanning mirror SSM.

Figure 17:
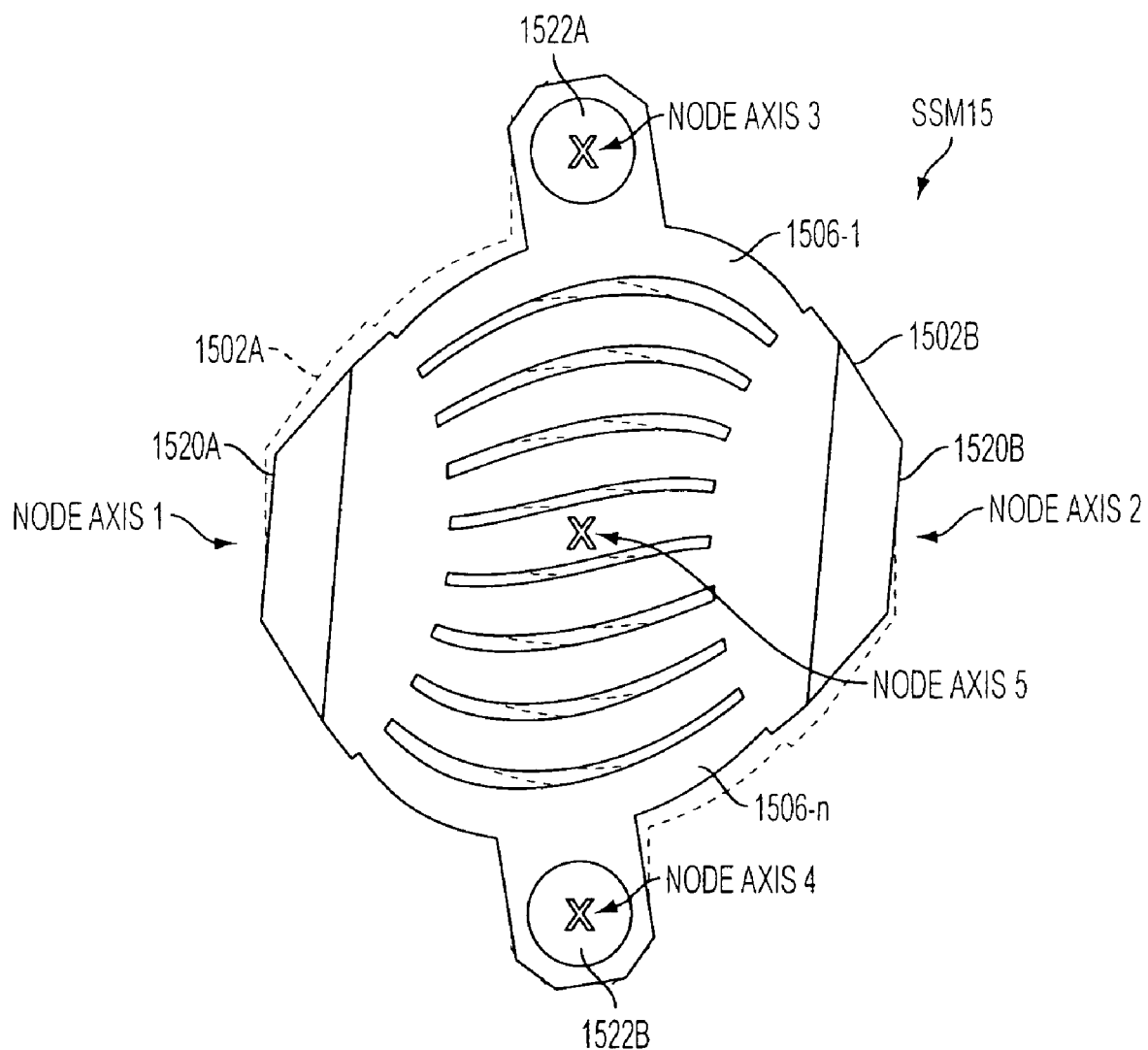

FIG. 17 shows an operational view of the synchronous scanning mirror SSM in FIGS. 15 and 16.

Figure 18:
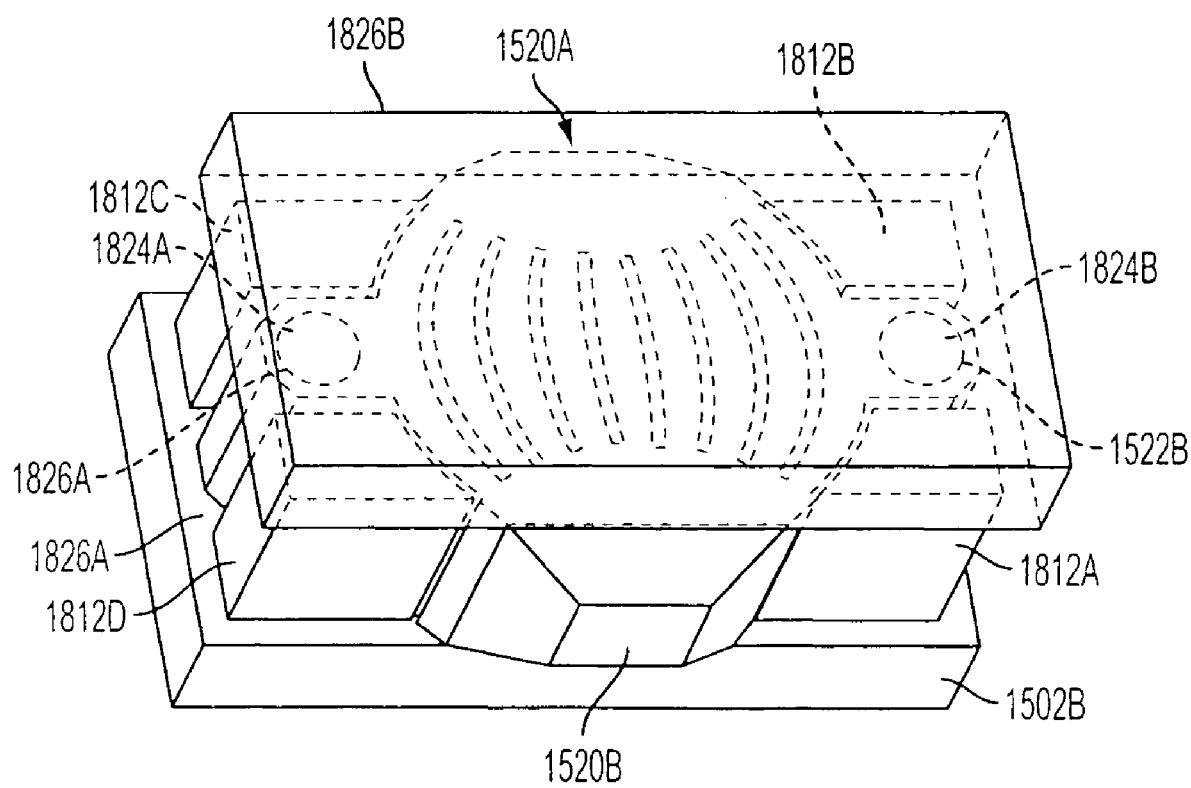

FIG. 18 shows an assembly and drive system for the synchronous scanning mirror SSM of FIGS. 15, 16, and 17.

Figure 19:
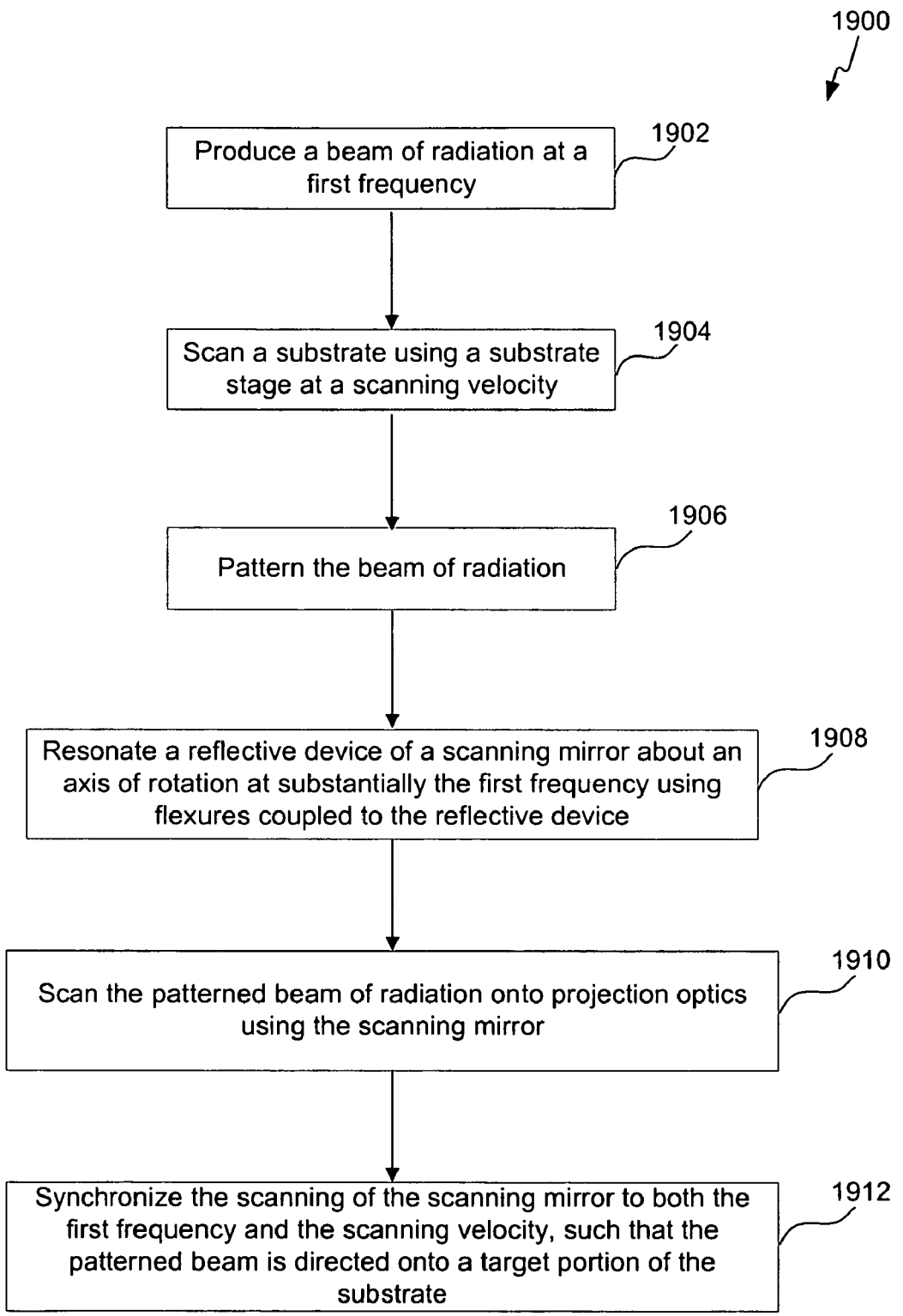

FIG. 19 shows a flowchart depicting a method according to the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Figure 1:
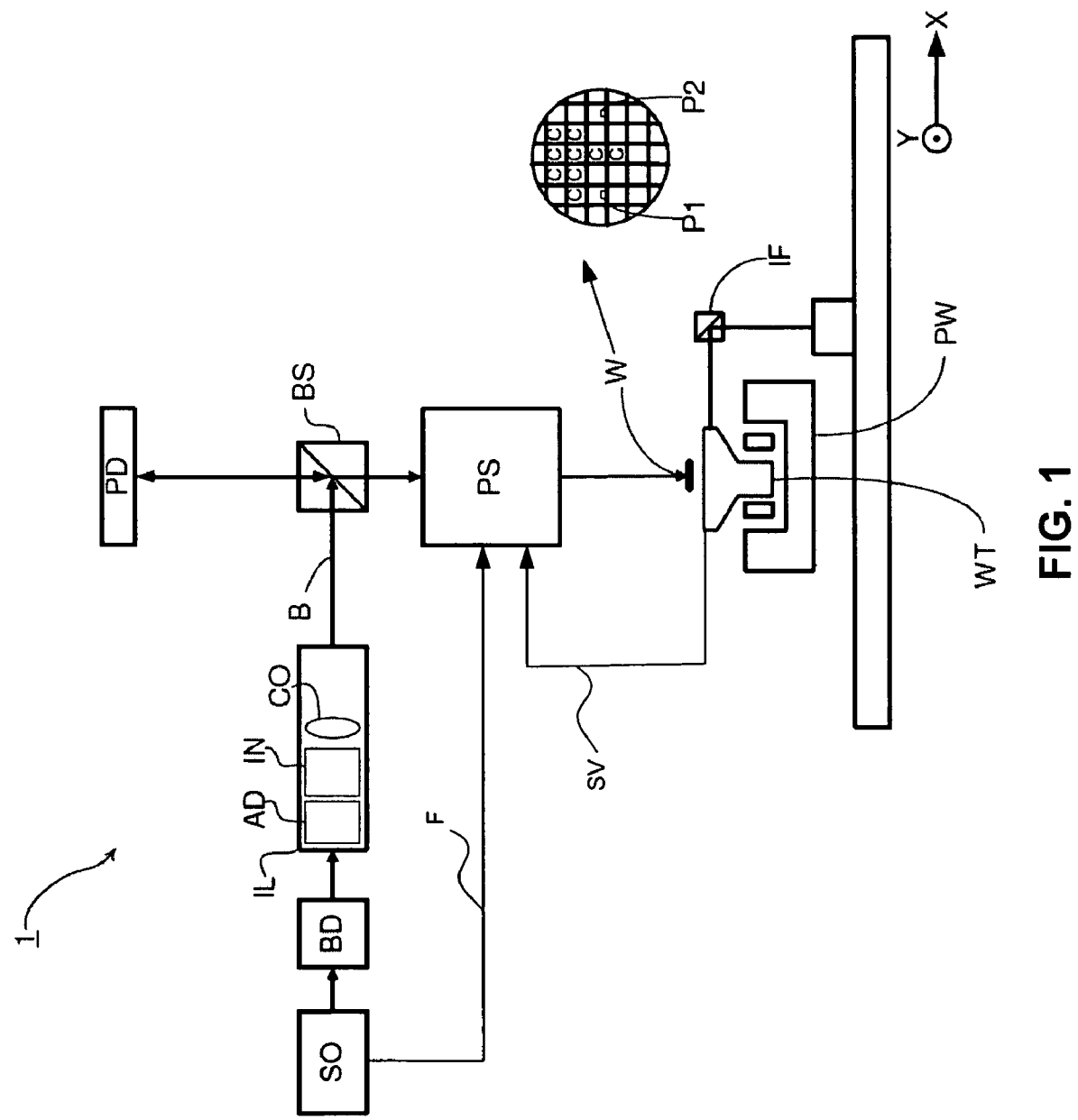
FIGS. 1 and 2 depict lithographic apparatus, according to various embodiments of the present invention.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system PS may include dynamic elements, such as a synchronous scanning mirror SSM as described below. The synchronous scanning mirror SSM can require a pulse frequency signal F from the radiation source SO and scan velocity signal SV from the substrate table WT to function, i.e., to control a resonant frequency of the synchronous scanning mirror SSM.

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate may be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA may be movable (e.g., with the use of one or more actuators) at least in the direction to and away from the substrate. Being able to move the MLA to and away from the substrate allows, e.g., for focus adjustment without having to move the substrate.

Figure 2:
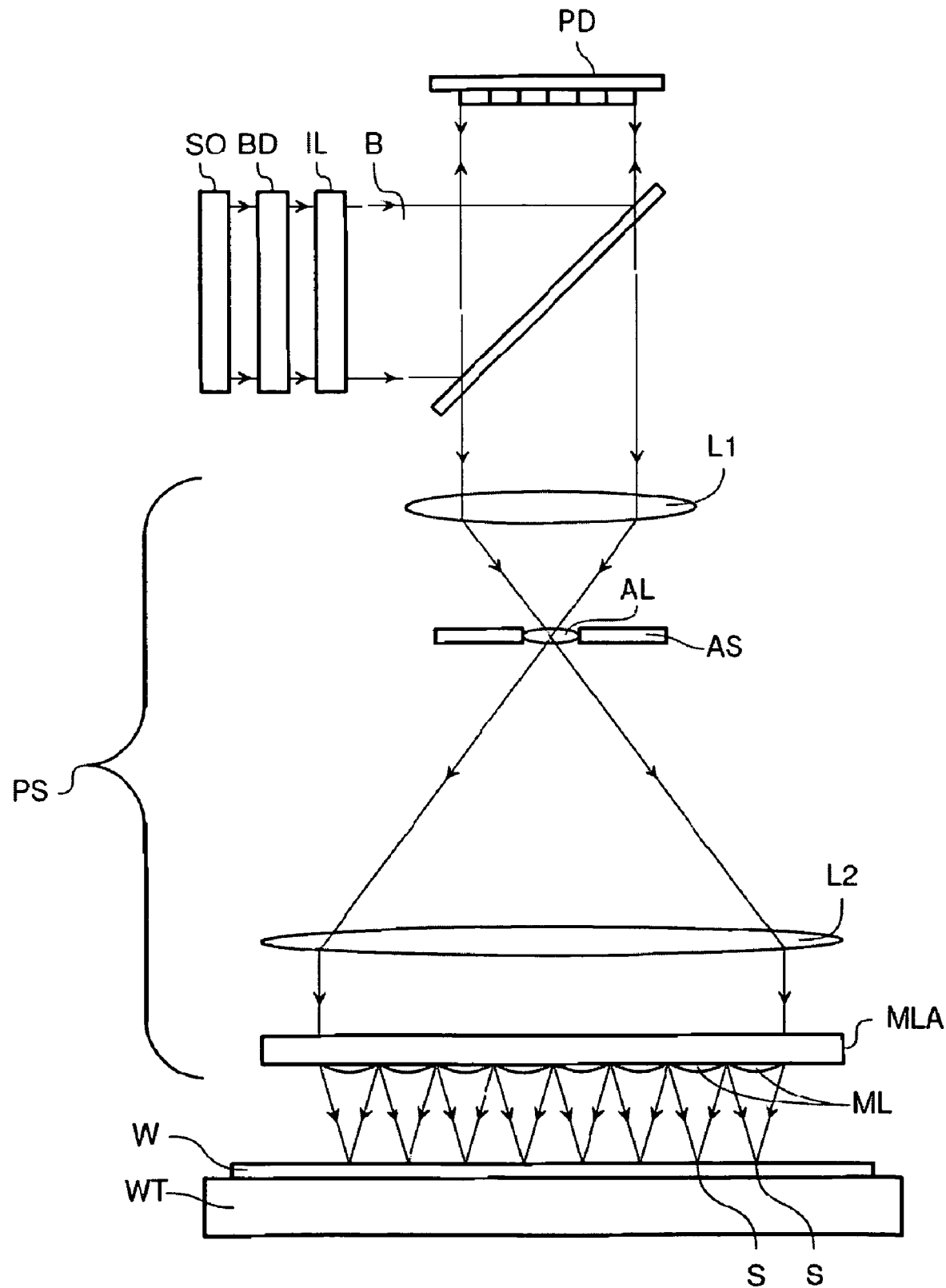

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation may have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
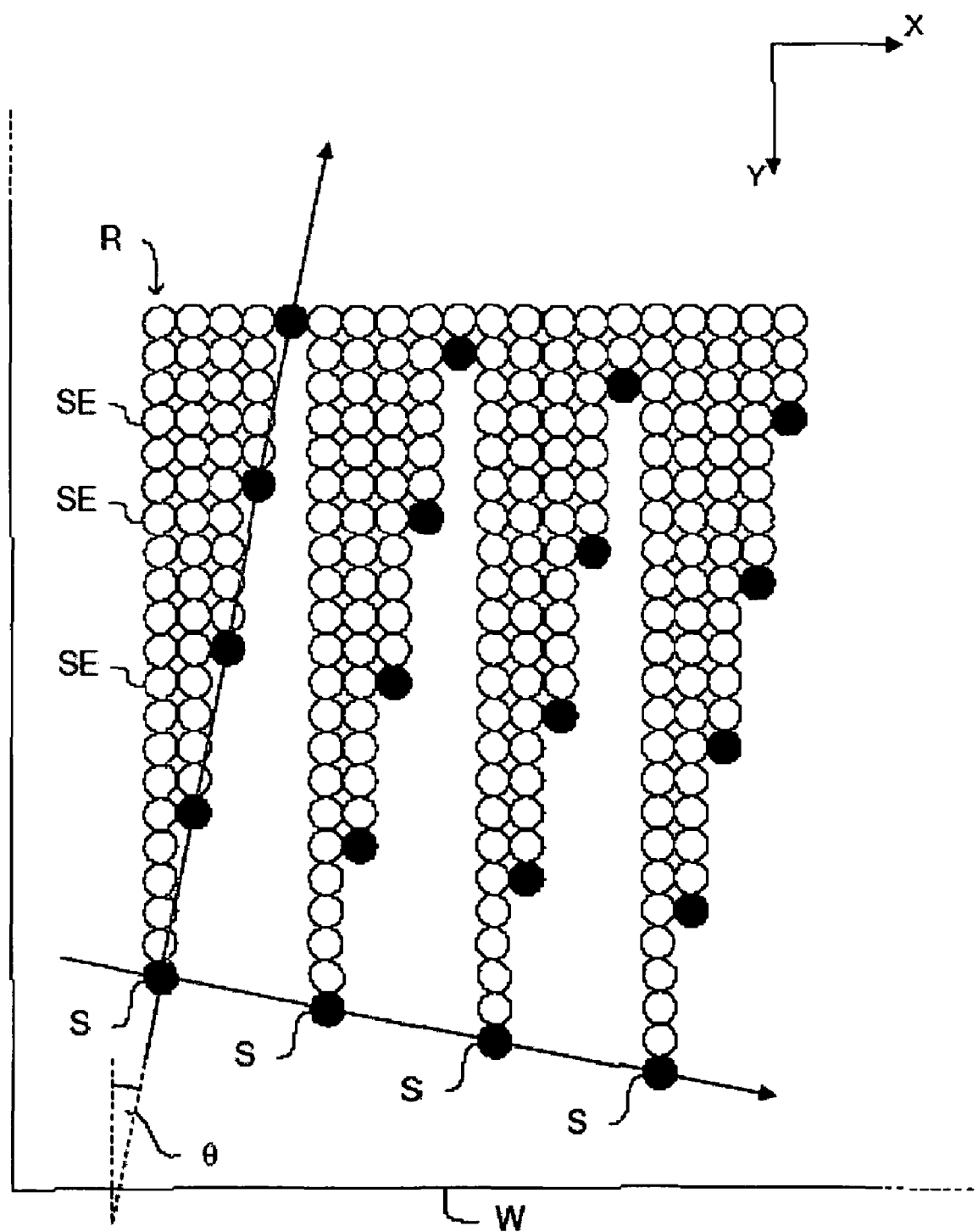
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle θ can be at most 20°, at most 10°, at most 5°, at most 3°, at most 1°, at most 0.5°, at most 0.25°, at most 0.10°, at most 0.05°, or at most 0.01°. Alternatively, the angle θ is at least 0.001°.

Figure 4:
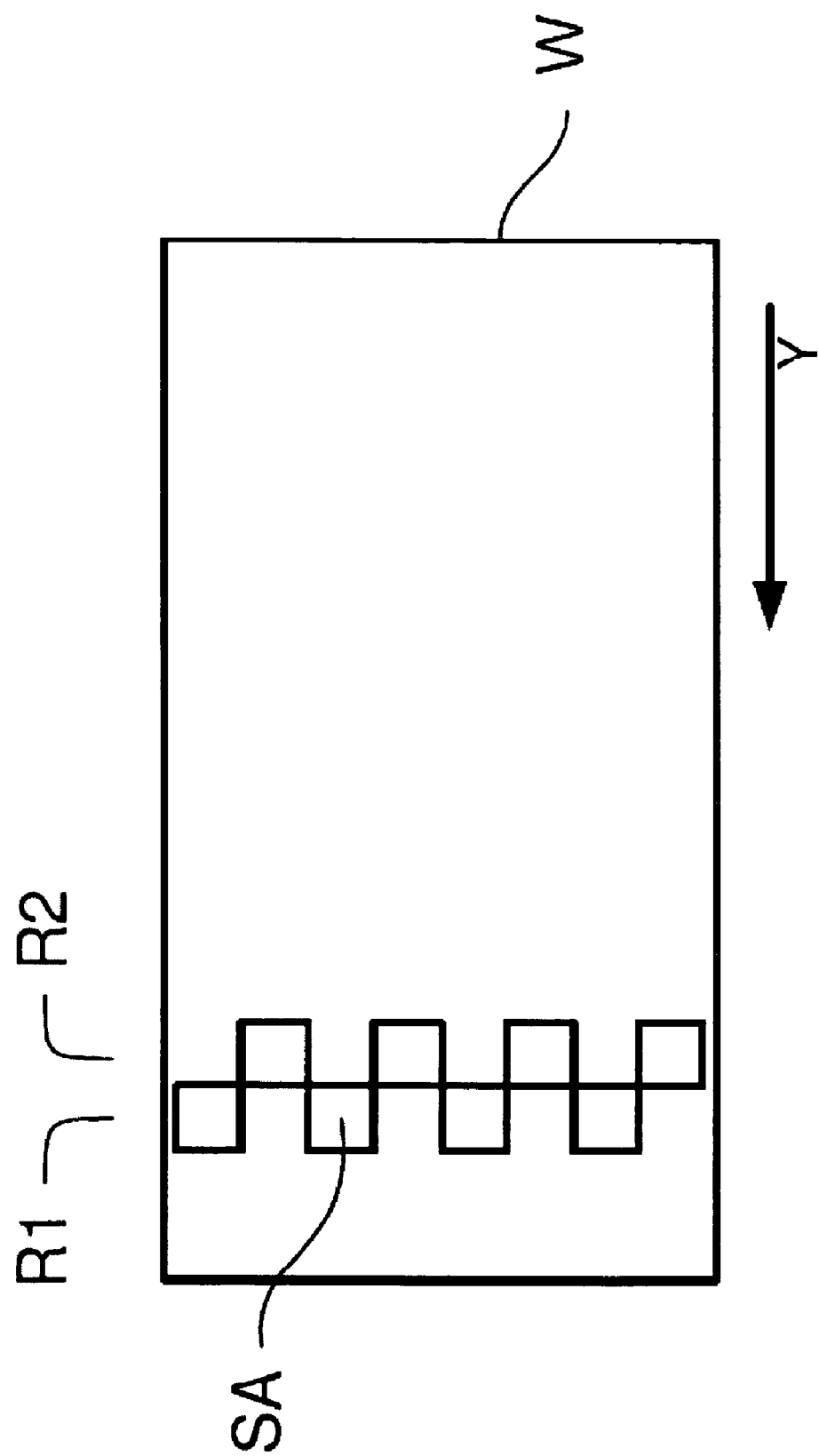
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Exemplary Exposure Systems

Figure 5:
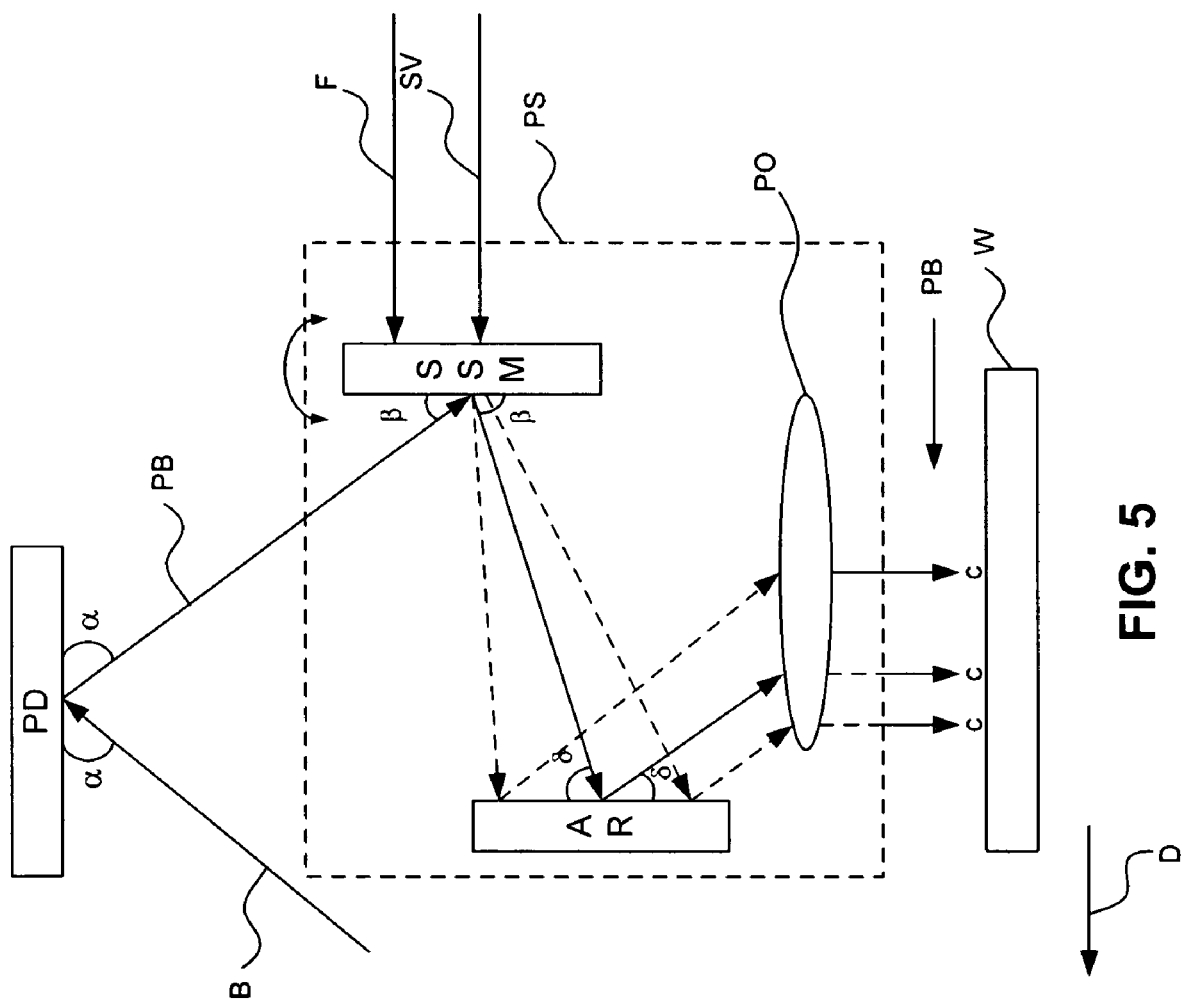
FIG. 5 shows a reflective patterning device directing patterned beams onto a projection system having a synchronous scanning mirror SSM.
Figure 6:
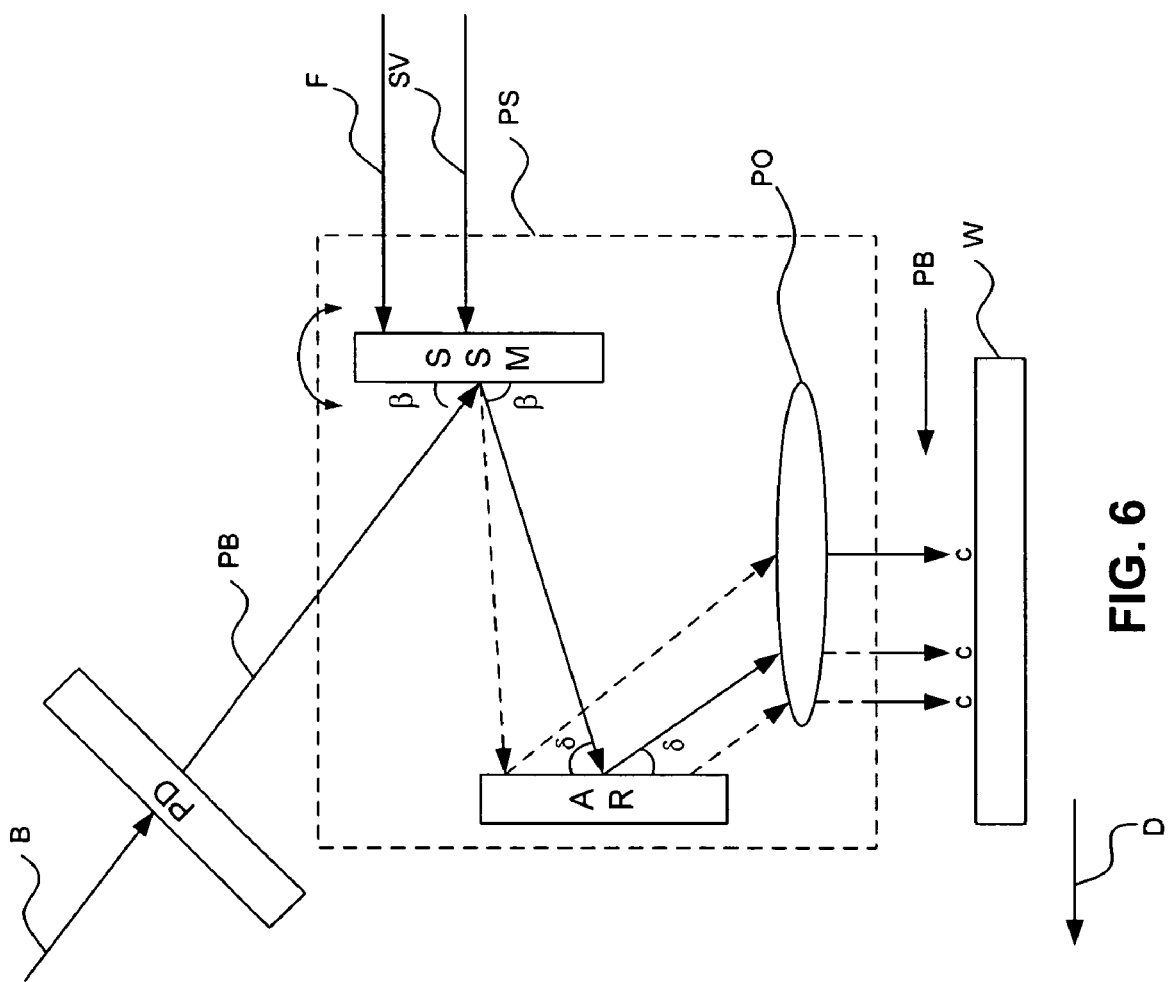
FIG. 6 shows a transmissive patterning device directing patterned beams onto a projection system having a synchronous scanning mirror SSM.
Figure 7:
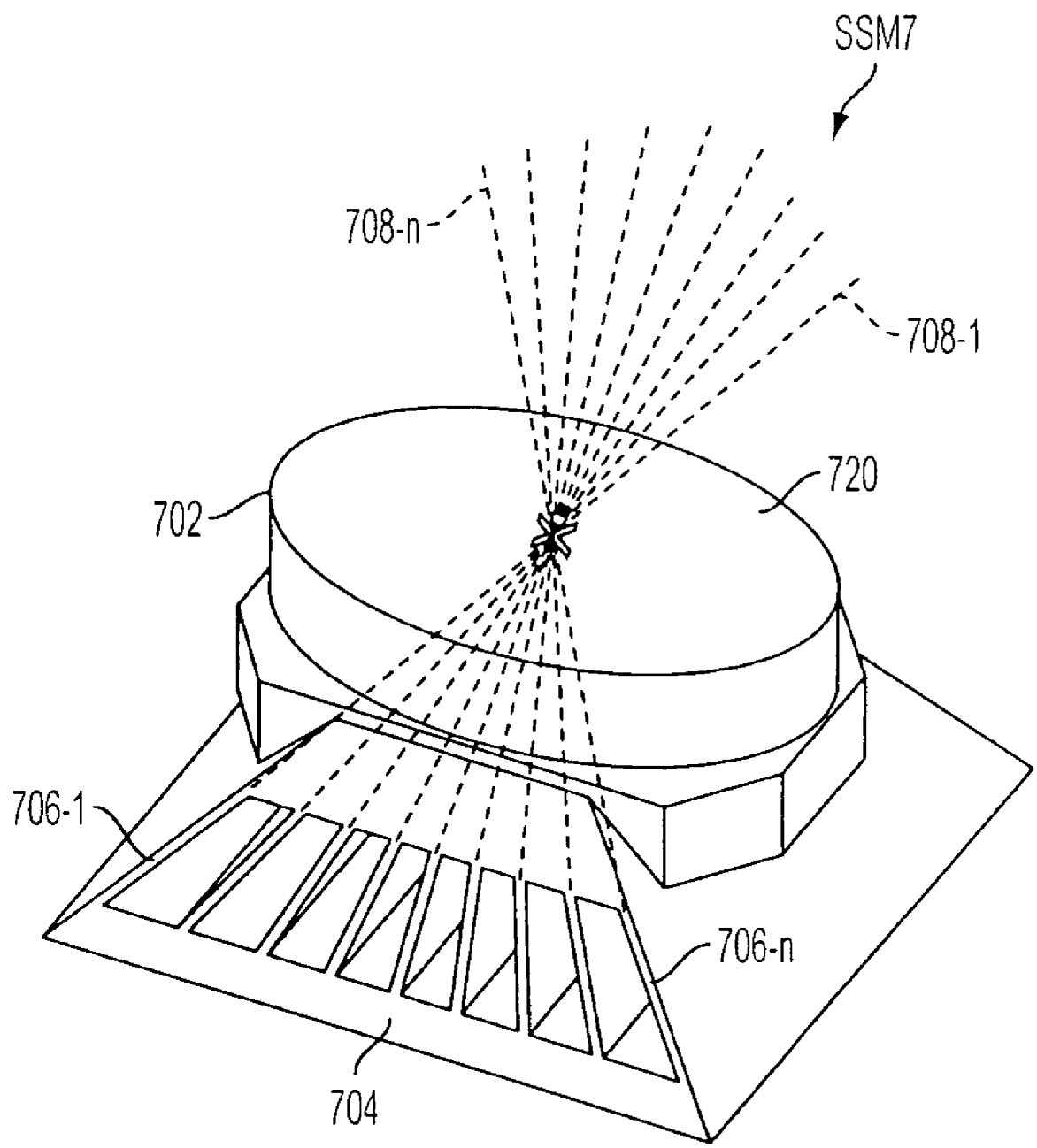
Figure 8:
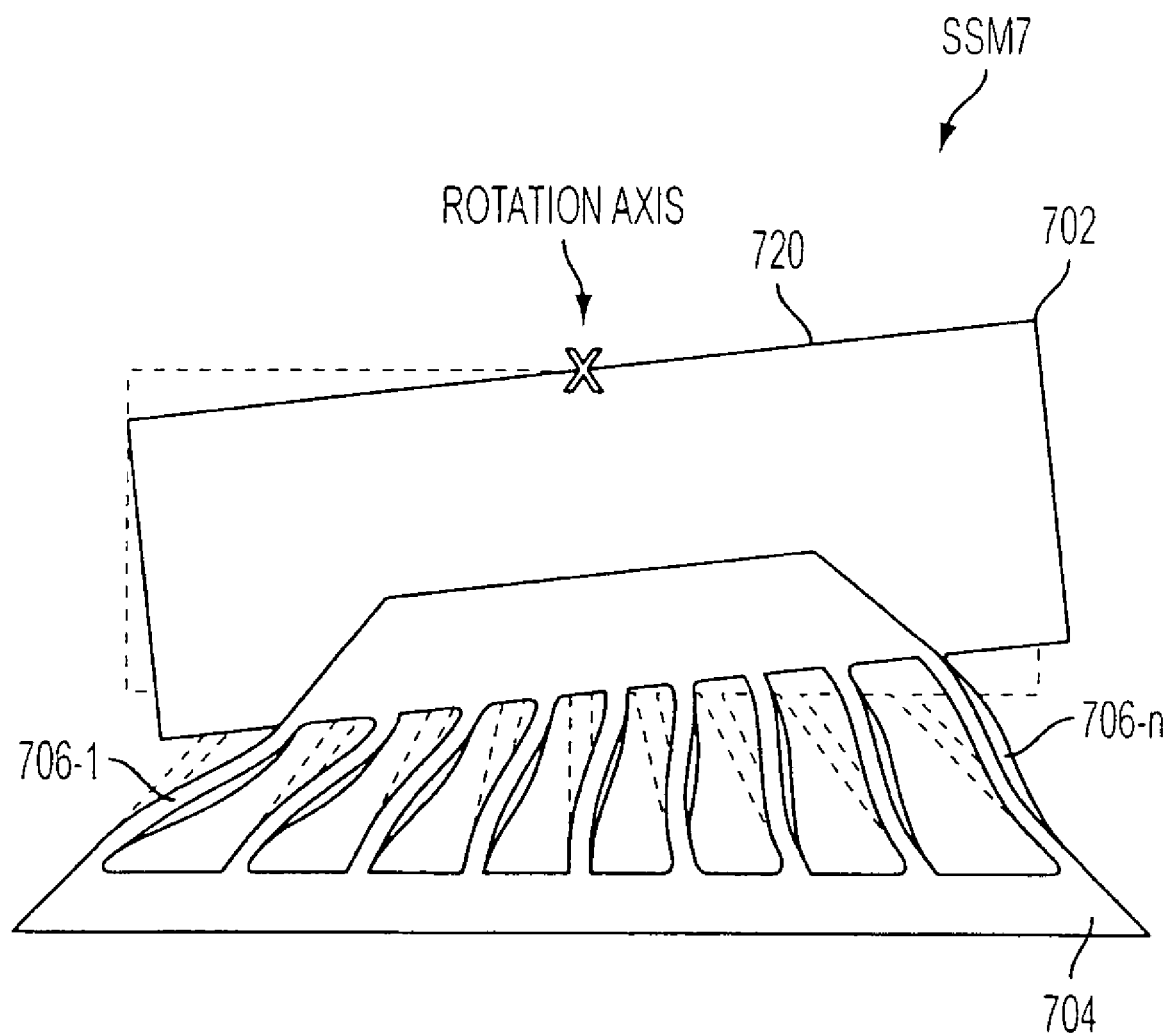
Figure 9:
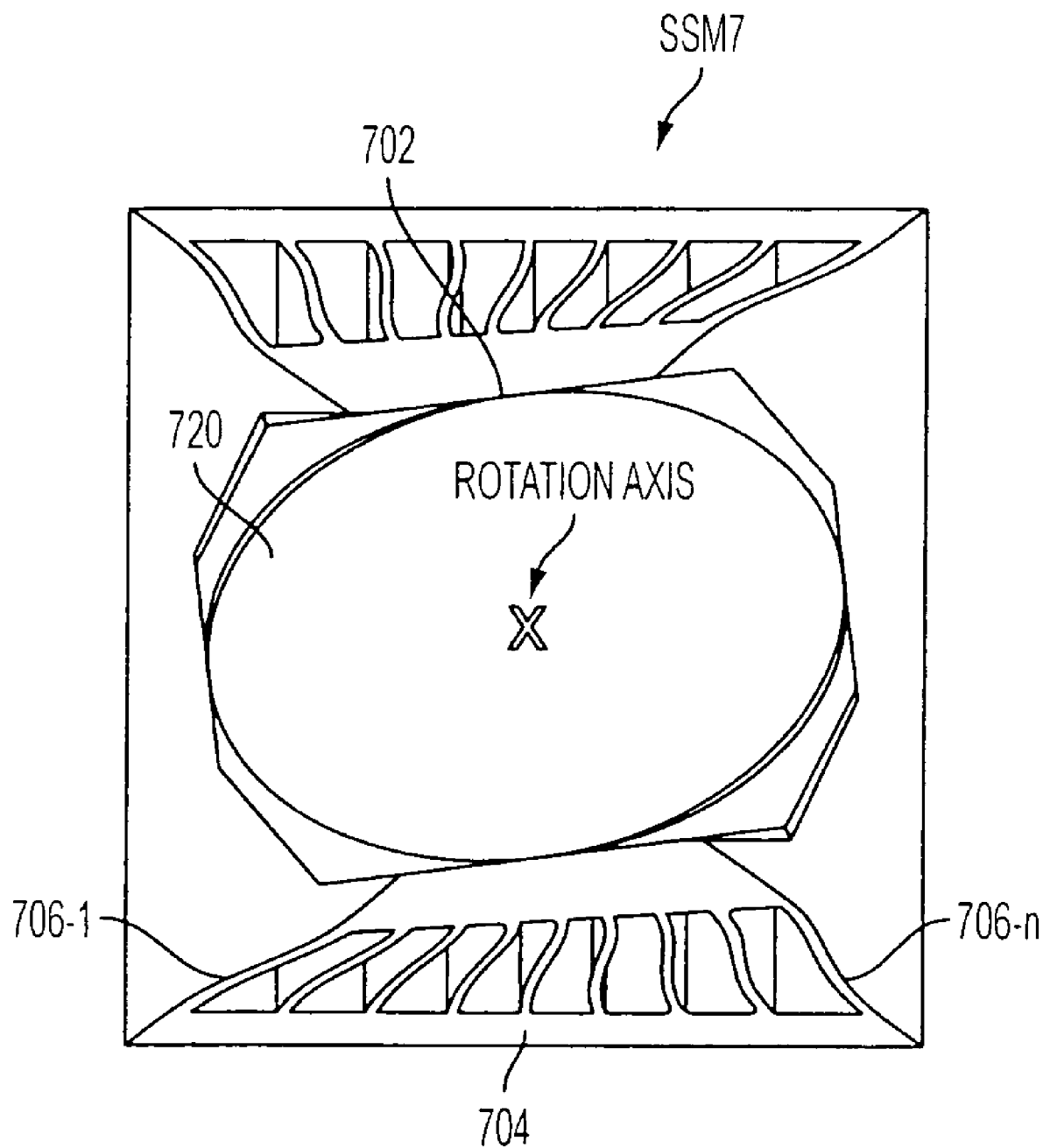
Figure 10:
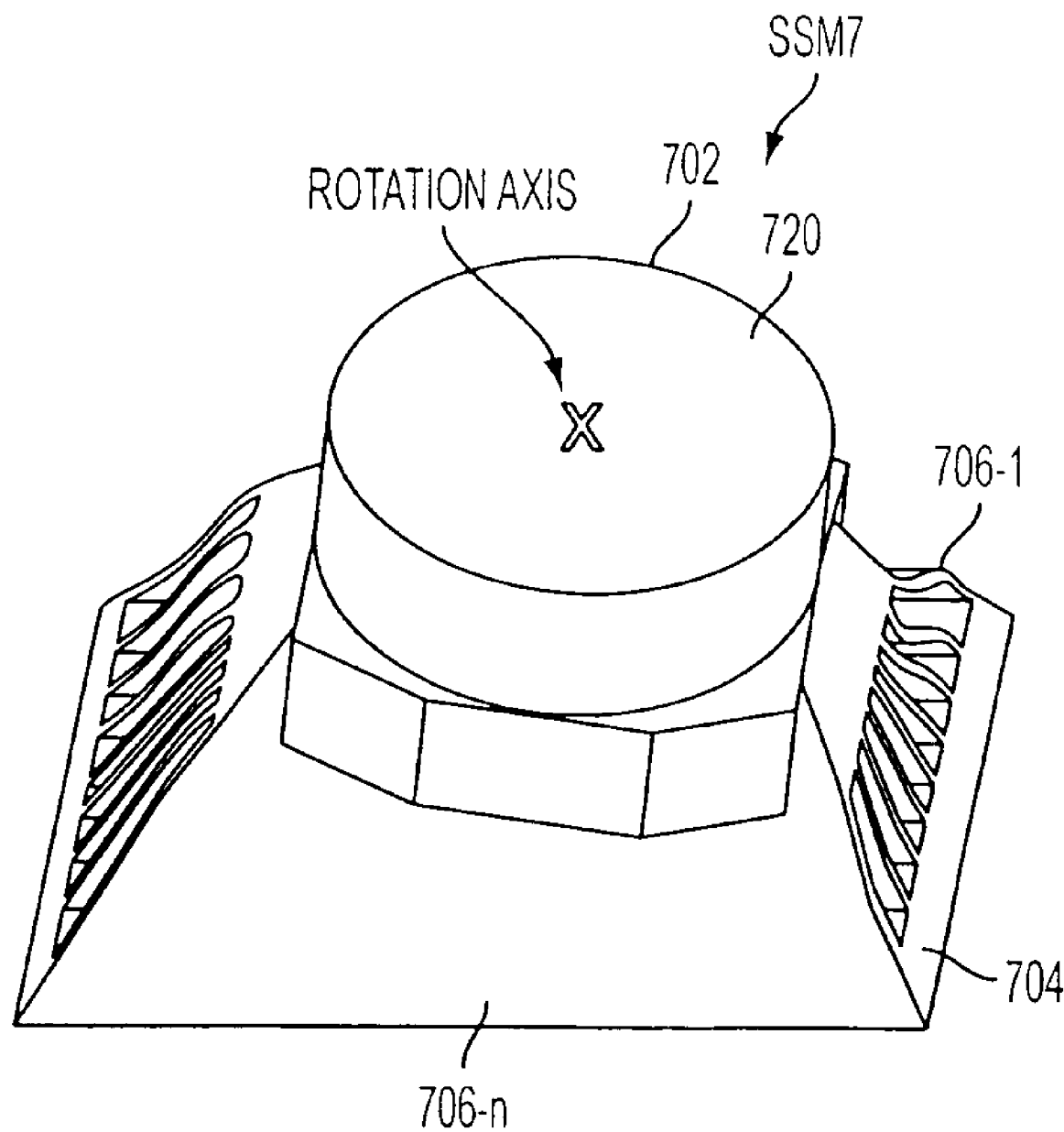

FIG. 5 shows a reflective patterning device PD directing patterned beams PB to a projection system PS having a synchronous scanning mirror SSM. Similarly, FIG. 6 shows a transmissive patterning device PD directing patterned beams to a projection system PS having a synchronous scanning mirror SSM. In both embodiments, projection system PS has the synchronous scanning mirror SSM, an optional astigmatism correcting optical element AR, and at least one projection optic PO. In operation, depending on a scan angle at a particular moment in time, patterned beam PB is scanned onto different positions of astigmatism correcting optical element AR using synchronous scanning mirror SSM (shown as dashed lines). This incident position on astigmatism correcting optical element AR controls where on projection optic PO patterned beam PB is directed, and in turn, where patterned beam PB leaves projection system PS (shown as dashed lines). Again, where patterned beam PB leaves projection system PS is based at least partially on knowing a scanning position (e.g., scanning velocity SV) of substrate W scanning in scan direction D (or in the opposite direction). In this way, patterned beam PB can interact with substrate W at a desired target position C.

Although not specifically shown, synchronous scanning mirror SSM is coupled to or otherwise mounted to a projection system PS housing, as discussed below.

In the systems shown in FIGS. 5 and 6, the synchronous scanning mirror SSM is a resonating mirror. The instantaneous angular velocity of the synchronous scanning mirror SSM during the instants in which it is impinged upon by the short pulses emitted by the source of radiation SO is chosen so that the velocity of the projected image measured from a fixed reference frame matches the velocity of the substrate table WT measured from the same fixed reference frame. In other words, instantaneous angular velocity is chosen so that the velocity of the projected image relative to the moving substrate W is zero. For a resonant synchronous scanning mirror SSM, the angular deflection of the mirror varies sinusoidally and the phase is controlled such that nominal radiation pulses (disregarding jitter) impinge onto the synchronous scanning mirror SSM when the deflection is zero. At zero deflection the angular velocity is at a maximum and equals the amplitude of the oscillation times the angular frequency. Thus, by controlling the amplitude of the oscillation and matching the angular frequency divided by $2\pi$ to the pulsing frequency of the source of radiation SO, the emitted radiation can be made to impinge on the substrate W at the correct position, when the jitter is small relative to the period of the oscillation (e.g., with jitter of about 50 nsec at 6 kHz, the period is about 166 microseconds, so this condition is met).

As discussed above, if the source of radiation SO has jitter, a pulsed beam may be generated before or after a desired moment in time. This can cause the patterned light beam PB (formed from the pulsed beam B interacting with the patterning device PD) to arrive at substrate W in front of or behind a desired position of target C. However, using the synchronous scanning mirror SSM, according to the embodiments of the present invention, even when jitter occurs in radiation source SO, the patterned beam PB will be directed onto a scanning substrate W supported by a scanning substrate table WT at a desired position. This is accomplished based on maintaining synchronization between both the synchronous scanning mirror SSM and the radiation source SO and between the synchronous scanning mirror SSM and the substrate table WT, which is described in more detail below. The synchronization can also be obtained without causing disturbances to the projection system PS, as described herein.

Additionally, if high order aberrations are determined through inaccurate movement of substrate stage WT, these aberrations can be feed forward to synchronous scanning mirror SSM, e.g., in the scan velocity signal SV. Through synchronizing with the actual movement of substrate stage WT, synchronous scanning mirror SSM can compensate or correct for these inaccuracies, and allow for the pattern to be printed at a desired target position C on substrate W.

FIG. 5 shows a reflective patterning device PD having angles of incidence and reflection of radiation B at an angle $\alpha$, which can be about 30 degrees, to form a patterned beam PB. The patterned beam PB is directed at angles of incidence and reflection from the synchronous scanning mirror SSM in projection system PS at an angle $\beta$, which can be about 30 degrees. In one example, the synchronous scanning mirror SSM directs the patterned beam PB at angles of incidence and reflection from an astigmatism correcting optical element AR at an angle $\gamma$, which can be about 30 degrees, before the patterned beam PB is received onto the projection optic PO in the projection system PS.

FIG. 6 shows a transmissive patterning device PD modifying a beam of radiation B to form a patterned beam PB. For example, the beam of radiation can be received normal to a patterning surface of the patterning device PD. The patterned beam PB is directed at angles of incidence and reflection from the synchronous scanning mirror SSM in projection system PS at an angle $\beta$, which can be about 30 degrees. In one example, the synchronous scanning mirror SSM directs the patterned beam PB at angles of incidence and reflection from an astigmatism correcting optical element AR at an angle $\gamma$, which can be about 30 degrees, before the patterned beam PB is received onto the projection optic PO in the projection system PS.

It is to be appreciated that unequal reflection angles could also be used in the systems of FIGS. 5 and 6 and/or that other angles of incidence and reflection could also be use, which alternatives are all contemplated within the scope of the present invention.

Exemplary Synchronous Scanning Mirrors SSMs

Example 1

FIGS. 7, 8, 9, and 10 show perspective, side, top, and operational perspective views of a synchronous scanning mirror SSM7. The synchronous scanning mirror SSM7 includes a reflective device 702 (e.g., a mirrored surface), a base 704, and a plurality of flexures 706-1 to 706-*n* (e.g., linear or blade like flexures) (n can be an integer greater than 1, and in the examples discussed below n is 9). In this configuration, an intersection of longitudinal axes 708-1 to 708-*n* of flexures 706-1 to 706-*n* is at a rotation axis X of synchronous scanning mirror SSM7, which is on a surface 720 of reflective device 702. In other words, the flexures 706 are disposed so that respective center planes of flexures 706 intersect at a common line, corresponding to the axis of rotation X of reflective device 702. Although reflective device 702 is shown as being elongated or oval, various shapes can be used based on a shape of the patterned beam PB (not shown) or other parameters, as would be known to a skilled artisan.

Flexures 706-1 to 706-*n* can have a known stiffness, but allow for flexing, as the name implies. Flexures 706 and reflective device 702 can be made from a same material, e.g., steel, steel alloys, titanium, beryllium, or the like, or can be made from different materials. It is desirable the material making up the flexures 706 have a high stiffness factor with small density and that the material have a long fatigue life. Stiffness is known to vary inversely with a third power of the thickness of flexures 706. Flexures 706 can all have a same thickness and length, although this is not required. Variation in tolerances in thickness and length of each individual flexure 706 is inversely proportional to a number of flexures 706 used. A collective stiffness of all the flexures 706 combined, in conjunction with a moment of inertia of reflective device 702, determines a resonant frequency of synchronous scanning mirror SSM7. Thus, individual flexures 706 can have varying thicknesses. Although nine flexures 706 are shown, any number can be used, but it is desirable to use more than two. It may be desirable to use a higher number of flexures 706, such that higher resonant modes are made inconsequential, as discussed below.

FIGS. 11 and 12 show perspective and side views, respectively, of synchronous scanning mirror SSM7 coupled to an isolation mass 1110 and a driving system 1212. In various examples, base 704 can be formed by a top surface 1113 of isolation mass 1110, or can be coupled to top surface 1113 of isolation mass 1110. Isolation mass 1110 is coupled to a surface 1114 of projection system PS via flexures 1116.

When synchronous scanning mirror SSM7 is unbalanced, isolation mass 1110 can be used to dampen or eliminate reaction forces (e.g., vibrations), which can cause disturbances to projection system PS by resonation of synchronous scanning mirror SSM7. If the reaction forces and/or vibrations caused by scanning of synchronous scanning mirror SSM7 are not substantially eliminated, they can lead to undesirable movement of optical elements within projection system PS. A resonant frequency of isolation mass 1110, through flexures 1116, can be an order of magnitude lower than a resonance frequency of synchronous scanning mirror SSM7. In this case, isolation mass 1110 forms a mechanical low pass filter. For example, if isolation mass 1110 resonates at 100 Hz and synchronous scanning mirror SSM7 resonates at 6 kHz, the isolation mass 1110 dampens the resonance of synchronous scanning mirror SSM7. Thus, projection system PS receives a much reduced amount of vibration or reaction force from the resonating of synchronous scanning mirror SSM7. Alternatively, further attenuation of vibrations transmitted to the projection system PS can be achieved by coupling force actuators and accelerometers to the isolation mass of FIGS. 11-14. This can be done to form an active isolation system, in which the actuators apply forces that are out of phase with the sensed vibration of the isolation mass.

With reference to FIG. 12, driving system 1212 can include an actuating system including first set of actuators 1214A and 1214B and second set of actuators 1216A and 1216B. Driving system 1212 can be, but is not limited to, coil and magnet, linear, or another type as would be apparent on a skilled artisan. An actuation force causes alternating ones of actuating elements 1216A and 1216B to be attracted (pulled) or repulsed (pushed) by actuating elements 1214A and 1214B. This, in turn, moves synchronous scanning mirror SSM7 around rotation axis X. For example, this can occur 6000 times a second, or at 6 kHz, to match a pulsing frequency of radiation source SO (not shown; see FIGS. 1 and 2).

For example, in a coil and magnet system, a drive coil 1214 (1214A and 1214B) can be embedded in or coupled to isolation mass 1110 and a drive magnet 1216 (1216A and 1216B) embedded in or coupled to synchronous scanning mirror SSM7, or vice versa.

Alternatively, coils coupled to base 1114 can interact with magnets coupled to mass 1110, (in lieu of coils 1214 and magnets 1216). The coils can be driven at the resonant frequency of the synchronous scanning mirror SSM and produce a small amplitude oscillatory motion of mass 1110. This motion would excite resonance of the synchronous scanning mirror SSM with a much larger amplitude. This indirect method of driving the synchronous scanning mirror SSM allows for not having to apply forces anywhere near the mirror surface, thus substantially eliminating a cause of mirror distortion. In the context of an indirectly driven system, mass 1110 can be referred to as a reaction mass (rather than an isolation mass)

Alternatively, a piezoelectric drive system, a magnorestrictive drive system, or other configurations of drive systems could be used without departing from the scope of the present invention. For example, flexures 706 could be formed of piezo material, which allows them to expand and contract to resonate at a desired frequency.

The arrangement of the flexures 706 completely behind the reflective device 702 can allow for to access the front of the reflective device 702 for polishing regardless of monolithic construction.

The use of a large number of thin flexures 706 can make it possible to dynamically separate a desired eigenmode from higher eigenmodes (e.g., to force the eigen-frequencies of undesired modes to be higher, so that the modes are less responsive to the driving frequency). The response of the higher undesired modes decreases one-hundred fold for each ten-fold increase in the ratio of the higher mode's eigenfrequency to the driving frequency. A system can be designed so that the first undesired higher mode has an eigenfrequency at least three times higher than the driving frequency. With this flexure configuration, the desired eigenmode is the fundamental (lowest frequency) eigenmode. The next eigenmode is a relatively harmless in-plane rotation and its frequency is about three times the fundamental frequency. Out of plane rotation about the axis orthogonal to the scanning axis X is an even higher mode, with eigenfrequency about four times the fundamental frequency. When the synchronous scanning mirror SSM7 is driven by a sinusoidal torque or force input at or near the fundamental frequency (6 kHz), there is large amplification of the desired scanning mode and large attenuation of all the other modes, due to their much higher eigenfrequencies. This produces the desired pure rotational motion about the scanning axis X to a large degree of approximation.

Using many thin flexures 706 instead of few thick ones can allow for, in a desired scanning mode, the flexures 706 to predominantly bend similar to a beam rigidly constrained at both ends. For this beam-like behavior, it is known that bending stiffness increases proportionally with the third power of the flexure's thickness. In the orthogonal, highly undesirable out of plane mode, the flexures 706 predominantly act as axial tension-compression members, one side of the flexure 706 elongating while the other contracts, alternating through the cycle. For this behavior, it is known that axial stiffness increases linearly with a thickness of the flexures 706. For example, by decreasing the thickness of each flexure 706 by a factor of two, and increasing the number of flexures 706 by a factor of eight, the eigenfrequency of the fundamental mode (dominated by beam-like flexure behavior) remains the same. The eigenfrequency of an undesired higher mode (dominated by axial tension-compression flexure behavior) is increased by a factor of four.

Another reason for using many flexures 706 is that, although the total amount of dynamic force applied on the mirror at resonance is the same regardless of how many flexures 706 are used, the amount of force applied by each flexure 706 is approximately the total dynamic force divided by the number of flexures 706. Therefore, when many flexures 706 are used, the force applied by each flexure 706 is very small and the total force is very evenly distributed, which tends to greatly reduce the distortion of the mirror.

FIGS. 13 and 14 show perspective and side views, respectively, of synchronous scanning mirror SSM7 similar to as shown in FIGS. 11 and 12 in an embodiment including an additional isolation mass 1318. Additional isolation mass (or reaction mass, depending on how the system is driven) 1318 can be used to further reduce or eliminate reactions forces or vibrations in projection system PS (not shown) (or to reduce the amplitude of ground motion required to stimulate a given amplitude of synchronous scanning mirror SSM motion at resonance)

In one example, base plate 704, flexures 706, and the reflective device 702 can be made from a single block of metal. In this example, even with a thick reflective device 702, the stiffness of this flexure design allows resonant operation at 6 kHz or even higher if desired. For example, manufacturing from a single block of metal by using wire-EDM (wire-Electrical Discharge Machining) process can yield the required tight tolerances at an affordable cost. Also, by being monolithic, the internal damping is minimized, which minimizes the power required to drive the synchronous scanning mirror SSM7. Furthermore, the challenges with attaching dissimilar materials (for example a glass mirror 702 to a metal base plate 704) are circumvented. Due to differences in thermal expansion among dissimilar materials, the attachment methods require substantial compliance between parts, in order not to distort the mirror.

Example 2

FIGS. 15 and 16 show a top and perspective view, respectively, of another embodiment of a synchronous scanning mirror SSM15. FIG. 17 shows an operational view of the synchronous scanning mirror SSM15 in FIGS. 15 and 16. Synchronous scanning mirror SSM15 includes first and second reflecting devices 1502A and 1502B, each having a reflecting surface 1520A and 1520B (see FIG. 16), respectively, that are coupled together by flexures 1506-1 to 1506-*n* (e.g., arcuate or curvilinear flexures). In contrast to substantially linear flexures 706, flexures 1506 are curvilinear flexures. Again, similar to synchronous scanning mirror SSM7 above, synchronous scanning mirror SSM15 is designed so that the ends of the flexures 1506 point to the rotation axis X of each mirror 1502A and 1502B, which lays in a plane of active surface 1520A and 1520B.

Synchronous scanning mirror SSM15 is coupled to a projection system PS (not shown) through a mechanical coupling device (not shown; but see FIG. 18) extending through bores 1522A and 1522B (e.g., cylindrical bores). As seen in FIG. 17, bores 1522A and 1522B extend through node axes 3 and 4, which are axes that exhibit no movement in the fundamental mode, which is the scanning mode of synchronous scanning mirror SSM15, as discussed below. In this example, only one of reflecting devices 1502 will be used for scanning an incoming patterned beam, while the other reflective device 1502 is used for balance, as discussed below. Through use of this counterbalancing, an isolation mass may not be needed in this example.

FIG. 18 shows cylindrical and flat air bearing assemblies 1822 and 1824, respectively, and a drive system 1812 (1812A to 1812D) for synchronous scanning mirror SSM15. Cylindrical air bearing assemblies 1824A and 1824B are coupled through respective bores 1522A and 1522B to respective flat air bearings or plates 1826A and 1826B. This arrangement of two planar air bearings 1826A and 1826B and two cylindrical air assemblies 1824A and 1824B can be used to constrain large rigid-body motions and dampen vibration modes, except for the fundamental mode.

In drive system 1812, diagonal pairs of the four electromagnetic actuators 1812A to 1812D can be used to pull on synchronous scanning mirror SSM15, or, alternatively, an element attached thereto (not shown), in an alternating fashion, as discussed below. For example, a first pair of actuators 1812A and 1812C can pull and then, 180 degrees out of phase with the first pair, a second pair of actuators 1812B and 1812D can pull. This stimulates synchronous scanning mirror SSM15 to resonate around each axis of rotation X on surfaces 1520A and 1520B of respective reflecting devices 1502A and 1502B. It will be immediately apparent to one skilled in the art upon reading this description that the same can be done with actuators that push instead of pull, and that only one pair of opposed actuators is sufficient if the forces are doubled. All these alternatives are contemplated within the scope of the present invention.

In one example, reflecting surface 1520A of reflective device 1502A can be used to scan an incoming patterned beam PB (not shown), while reflecting surface 1520B of counterbalancing reflective device 1502B can be used as a target for sensors (e.g. capacitance gauges) for measuring position and phase of the resonating device It is to be appreciated, as discussed above, other drive systems can also be used, as would be apparent to a skilled artisan upon reading and understanding this description.

In one example, a dynamic behavior of the balanced synchronous scanning mirror SSM15 in its fundamental (lowest) resonant mode allows for an eigenfrequency of the fundamental mode to be just slightly higher than 6 kHz, assuming that the synchronous scanning mirror SSM15 is made of steel. However, as discussed above, other materials could, also be used. The deflection of synchronous scanning mirror SSM15 is entirely in-plane in this mode. For example, this is shown in FIG. 17. Synchronous scanning mirror SSM15 shown in FIG. 17 is completely free (unconstrained) and it exhibits five node axes (lines where the displacement of each point is naturally zero). Node axes 1 and 2 coincide with the desired axes of rotation X of respective surfaces 1520A and 1520B. Node axis 5 runs through a center of mass, which satisfies the condition that the synchronous scanning mirror SSM 15 be dynamically balanced. Node axes 3 and 4 coincide with the centerlines of the bores 1522A and 1522B, respectively. When synchronous scanning mirror SSM15 is symmetric about the horizontal and vertical center planes that go through the center of mass, nodes 1 and 2 lay on the horizontal center plane and nodes 3 and 4 lay on the vertical center plane.

Additionally, adjusting a curvature of each of the flexures 1506, while maintaining symmetry, can allow for the distance of node axes 1 and 2 from the vertical center plane to be adjusted until these node axes lay on the mirror surfaces 1520A and 1520B, respectively.

Also, through adjusting of a distance of the bores 1522A and 1522B to the horizontal center plane while maintaining symmetry, node axes 3 and 4 can be made to coincide with the centerline of the bores 1522A and 1522B, respectively.

The inner flexures 1506-2 to 1506-8 may be used to contribute out-of plane stiffness, raising the eigenfrequencies of the other modes. Also, the inner flexures 1506-2 to 1506-8 may contribute to keeping the stress on the back of the reflective devices 1502A and 1502B lower by distributing dynamic loads more evenly, thus improving flatness of reflective devices 1502A and 1502B.

In an example when air at high pressure is introduced between each planar air bearing 1826A and 1826B, a thin air film is generated on each flat side of synchronous scanning mirror SSM15. The use of air bearing assemblies 1826A and 1826B can allow for a) a higher effective stiffness and b) providing an effective means to damp unwanted modes. The damping phenomenon occurring in air bearing assemblies 1826A and 1826B is commonly called "squeeze-film damping," which can vary inversely with the third power of the air film thickness.

Each cylindrical air bearing assembly 1824A and 1824B can be coupled at both ends to the respective plates 1826A and 1826B, such that the assemblies 1824A and 1824B are parallel to the bores 1522A and 1522B. This can be accomplished by in-situ epoxying or by providing moment relieved shaft mounting surfaces on the plates using flexures (not shown).

Small holes in the air bearing assemblies 1824A and 1824B (not shown) may be used to introduce air at high pressure, creating a thin air film between the assemblies 1824A and 1824B and the respective bores 1522A and 1522B to form cylindrical hydrostatic air bearings.

To excite the fundamental mode of the synchronizing scanning mirror SSM15, the two sets of diagonally opposed electromagnetic actuators 1812 (e.g., actuator pairs 1812A/1812C and 1812B/1812D) can be used. Each set comprises two actuators that are driven in phase. If the synchronizing scanning mirror SSM15 is made of a magnetic material, e.g., steel, the actuators 1812 can be, for example, reluctance actuators, electromagnets, or the like, which exert a pulling force on the outer flexures 1506-1 and 1506-*n*. The diagonally opposed sets are driven 180 degrees out of phase relative to each other. It should be noted that the equal and opposite set of forces used to excite the synchronizing scanning mirror SSM15 can be canceled out, so there may be no net reaction force fed into the supporting structure (i.e., no mechanical vibration transmitted to the projection system PS).

Due to the high Q (e.g., damping factor) of the synchronizing scanning mirror SSM15, which can be made from a monolithic block of metal and supported frictionlessly by air, a relatively small driving force is enough to achieve the small angular deflection of the mirror surfaces 1520A and 1520B (1.2 miliradian). In one example, synchronizing scanning mirror SSM15 can be manufactured from a single block of metal using wire-EDM process, which yields the required tight tolerances at an affordable cost. Also, by being monolithic, the internal damping is minimized, which minimizes the power required to drive the synchronizing scanning mirror SSM15.

The arrangement of the flexures 1506 completely behind the mirrors 1502A and 1502B makes it possible to access the front of the mirrors 1502A and 1502B for polishing.

Additionally, the dynamic balance of the synchronizing scanning mirror SSM15, and the resulting zero net driving force transmitted to the projection system PS, make this a desirable configuration for a synchronizing scanning mirror SSM.

Exemplary Operation

FIG. 19 shows a flowchart depicting a method 1900. For example, method 1900 can be performed using one of the systems described above with respect to FIGS. 1-18. In step 1902, a beam of radiation pulses is produced at a first frequency. In step 1904, a substrate is scanned using a substrate stage at a scanning velocity. In step 1906, the pulse or beam of radiation is patterned. In step 1908, a reflective device of a scanning mirror is resonated about an axis of rotation at substantially the first frequency using flexures coupled to the reflective device. In an optional step 1910, the patterned pulse or beam of radiation is scanned onto projection optics using the scanning mirror. In step 1912, the scanning of the scanning mirror is synchronized to both the first frequency and the scanning velocity, such that the patterned pulse or beam is directed onto a target portion of the substrate Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithography apparatus, comprising:
a patterning device that is configured to pattern a beam of radiation and generate patterned beam pulses, the patterned beam pulses having a first frequency;
a substrate table configured to support and scan a substrate at a scanning velocity; and
a projection system including a scanning device, the scanning device including a reflective device and a plurality of flexures, the plurality of flexures being coupled to and extending from a bottom surface of the reflective device and being configured to allow the reflective device to resonate about an axis of rotation, wherein the scanning device is configured to scan the patterned beam pulses onto a target area of the substrate, and
wherein the resonant frequency of the scanning device is substantially a same value as the first frequency, an angular deflection of the scanning device is synchronized with a position of the substrate table, and an amplitude of resonant motion is controlled to substantially match an angular velocity of the scanning device to the scanning velocity of the substrate table during each of the pulses.

2. The lithography apparatus of claim 1, wherein the plurality of flexures are aligned such that a center plane of each flexure intersects at the axis of rotation of the scanning device, the axis of rotation being located at a reflective surface of the scanning device.

3. The lithography apparatus of claim 1, wherein the plurality of flexures are made from steel, steel alloy, beryllium, beryllium alloy, titanium, or titanium alloy.

4. The lithography apparatus of claim 1, wherein the beam of radiation is incident at an angle with respect to the reflective device of about 30 degrees to 60 degrees.

5. The lithography apparatus of claim 1, wherein the reflective device comprises an elongated reflecting surface.

6. The lithography apparatus of claim 1, wherein the scanning device further comprises:
a driving system that is configured to cause the reflective device to resonate about the axis of rotation at a second frequency.

7. The lithography apparatus of claim 6, wherein the driving system comprises:
first and second magnets coupled to opposite ends of the reflective device; and
complementarily located first and second coils that receive an alternating current signal.

8. The lithography apparatus of claim 1, wherein the plurality of flexures comprise a plurality of curvilinear or arcuate flexures and center planes of each of the plurality of flexures intersect substantially at the axis of rotation of the reflective device.

9. The lithography apparatus of claim 1, wherein:
the scanning device has first and second oppositely directing ones of the reflective device each having a respective one of the axis of rotation, such that a selected one of the reflective devices is used to scan the patterned beam pulses onto the optical system.

10. The lithography apparatus of claim 9, wherein the scanning device further comprises:
a driving system having first and second pairs of electromagnets, wherein alternating ones of the first and second pairs of electromagnets are energized to allow for the resonating of the first and second reflective devices around the respective axes of rotation.

11. The lithography apparatus of claim 1, wherein the scanning device is coupled to the projection system via a isolation mass-flexure arrangement, such that vibrations caused by resonating of the scanning device are substantially eliminated.

12. The lithography apparatus of claim 11, wherein the scanning device is stimulated into resonance indirectly by actuators coupled at one end to the isolation mass and at the other end to the projection system, such that no driving forces are applied directly to the reflective device thus substantially eliminating distortion.

13. The lithography apparatus of claim 1, wherein the reflective device and the plurality of flexures comprise a monolithic structure.

14. The lithography apparatus of claim 1, wherein:
the projection system further comprises an optical system;
the scanning device is configured to scan the patterned beam pulses onto the optical system; and
the optical system is configured to project the patterned beam pulses onto the target area of the substrate.

15. A device manufacturing method, comprising:
(a) producing a beam of radiation at a first frequency;
(b) scanning a substrate using a substrate stage at a scanning velocity;
(c) patterning the beam of radiation;
(d) resonating a reflective device of a scanning mirror about an axis of rotation at substantially the first frequency using flexures coupled to and extending from a bottom surface of the reflective device; and
(e) synchronizing the scanning of the scanning mirror to both the first frequency and the scanning velocity, such that the patterned beam is directed onto a target portion of the substrate.

16. The method of claim 15, wherein step (d) comprises using linear flexures having center planes that cross at the axis of rotation.

17. The method of claim 15, wherein step (d) comprises using curvilinear or arcuate flexures having center planes that cross at the axis of rotation.

18. The method of claim 15, wherein before step (e), the patterned beam of radiation is scanned onto projection optics using the scanning mirror, such that the projection optics are utilized to project the patterned beam onto the target portion of the substrate.

19. The lithography apparatus of claim 9, further comprising two cylindrical air bearings supporting the scanning device at two nodes.

20. The lithography apparatus of claim 9, further comprising a planar air bearing supporting the scanning device at a planar face.

21. A lithography apparatus, comprising:
a patterning device configured to pattern a beam of radiation, the beam of radiation having a first frequency;
a substrate table that supports and scans a substrate at a scanning velocity; and
a projection system including a scanning device, the scanning device including a reflective device and a plurality of flexures, the plurality of flexures being coupled to and extending from a bottom surface of the reflective device and being configured to allow the reflective device to resonate about an axis of rotation, wherein the scanning device is configured to scan the patterned beam onto a target area of the substrate, and
wherein the resonant frequency of the scanning device is substantially a same value as the first frequency, and is synchronized with the scanning velocity.

* * * * *